United States Patent
Baek et al.

(10) Patent No.: US 8,159,883 B2
(45) Date of Patent: Apr. 17, 2012

(54) SEMICONDUCTOR MEMORY DEVICE HAVING A BLOCK DECODER FOR PREVENTING DISTURBANCE FROM UNSELECTED MEMORY BLOCKS

(75) Inventors: Kwang Ho Baek, Seoul (KR); Sam Kyu Won, Yongin-si (KR); Jae Won Cha, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 759 days.

(21) Appl. No.: 12/163,905

(22) Filed: Jun. 27, 2008

(65) Prior Publication Data
US 2009/0040830 A1 Feb. 12, 2009

(30) Foreign Application Priority Data
Aug. 6, 2007 (KR) .......................... 10-2007-0078545

(51) Int. Cl.
*G11C 16/08* (2006.01)
(52) U.S. Cl. ......... 365/185.23; 365/185.17; 365/185.02; 365/185.13; 365/185.11; 365/185.25
(58) Field of Classification Search ............. 365/185.17, 365/185.02, 185.12, 185.13, 185.11, 185.23, 365/185.25, 185.33
See application file for complete search history.

(56) References Cited

U.S. PATENT DOCUMENTS

| 7,315,472 B2 * | 1/2008 | Lee ........................... 365/185.17 |
| 7,450,418 B2 * | 11/2008 | Liao et al. ................ 365/185.05 |
| 7,646,640 B2 * | 1/2010 | Ryu et al. ................. 365/185.11 |
| 2008/0247234 A1 * | 10/2008 | Lee ........................... 365/185.13 |
| 2009/0040830 A1 * | 2/2009 | Baek et al. ............... 365/185.13 |

FOREIGN PATENT DOCUMENTS

| CN | 1183163 | 5/1998 |
| KR | 10-2002-0038862 A | 5/2002 |
| KR | 10-2007-0018216 A | 2/2007 |

\* cited by examiner

*Primary Examiner* — Andrew Q Tran
(74) *Attorney, Agent, or Firm* — Kilpatrick Townsend & Stockton LLP

(57) ABSTRACT

A semiconductor memory device can improve electrical properties by prohibiting a leakage current, which flows through a memory cell, in such a way as to turn off a drain select transistor, a source select transistor and a side transistor of an unselected memory cell block when the semiconductor memory device operates. The semiconductor memory device includes a memory cell block in which a plurality of memory cells, drain and source select transistors, and side word line transistors are connected in a string structure, a block decoder for outputting a block select signal in response to predecoded address signals and controlling the drain and source select transistors and the side word line transistors, and a block switch for connecting a global word line to word lines of the memory cell block in response to the block select signal.

14 Claims, 2 Drawing Sheets

SEMICONDUCTOR MEMORY DEVICE HAVING A BLOCK DECODER FOR PREVENTING DISTURBANCE FROM UNSELECTED MEMORY BLOCKS

CROSS-REFERENCE TO RELATED APPLICATIONS

The present application claims priority to Korean patent application number 10-2007-0078545, filed on Aug. 6, 2007, which is incorporated by reference in its entirety.

BACKGROUND OF THE INVENTION

The present invention relates to a block decoder and a semiconductor memory device including the same and, more particularly, to a block decoder which can prevent the malfunction of a semiconductor memory device due to a leakage current of the device.

Recently, there has been an increasing demand for semiconductor memory devices which can be electrically programmed and erased and do not need a refresh function of rewriting data at specific intervals. In order to develop large-capacity memory devices capable of storing a large amount of data, research has been conducted on the high integration of memory devices particularly flash memory.

Flash memory is generally classified into NAND flash memory and NOR flash memory. NOR flash memory has a structure in which memory cells are independently connected to bit lines and word lines and therefore exhibits an excellent random access time characteristic. NAND flash memory has a structure in which memory cells are connected in series, requiring only one contact per cell string, and therefore exhibits an excellent integration level characteristic. Accordingly, the NAND structure is generally used in high-integrated flash memory.

In general, a flash memory device requires a block decoder for selecting a memory cell array on a per block basis to perform program, read and erase operations of a memory cell.

FIG. 1 is a circuit diagram showing a block decoder of a conventional flash memory device.

Referring to FIG. 1, a NAND gate ND1 logically combines address signals XA, XB, XC and XD. A NAND gate ND2 logically combines an output signal of the NAND gate ND1 and a program precharge signal PGMPREb. When at least one of the address signals XA, XB, XC and XD is input at a low level, the NAND gate ND1 outputs a high-level signal. When at least one of the output signal of the NAND gate ND1 and the program precharge signal PGMPREb is input at a low level, the NAND gate ND2 outputs a high-level signal.

A NAND gate ND3 logically combines an output signal of the NAND gate ND2 and a block enable signal EN. When the block enable signal EN is applied at a low level, the NAND gate ND3 outputs a high-level signal to turn on a transistor N2. Thus, a node Q1 is reset.

A transistor N1 is turned in response to a precharge signal PRE, such that the output signal of the NAND gate ND2 is applied to the node Q1. The potential of the node Q1 functions as a block select signal BLKWL. Transistors N3 and N4 are turned on in response to first and second control signals GA and GB of a pumping voltage (Vpp) level, respectively, such that t he pumping voltage Vpp is applied to the node Q1. Thus, a block switch 20 operates in response to the potential of the node Q1, that is, the block select signal BLKWL. Accordingly, global word lines GWL<31;0> and word lines of a memory cell array 30 are connected.

A semiconductor memory device including the above block decoder selects only one memory cell block when operating and connects the selected memory cell block to the global word line. However, unselected memory cell blocks are disconnected from the global word line. A sensing margin of the selected memory cell block is decreased due to a bit line leakage current through a memory cell in the unselected memory cell blocks. That is, the leakage current is generated in which charges of a precharged bit line are discharged through the memory cell in the unselected memory blocks. Accordingly, an error may occur during a sensing operation of a selected memory cell.

BRIEF SUMMARY OF THE INVENTION

The present invention is directed towards a semiconductor memory device, which can improve electrical properties by preventing a leakage current, which flows through a memory cell, in such a way as to turn off a drain select transistor, a source select transistor and a side transistor of an unselected memory cell block when the semiconductor memory device operates.

A semiconductor memory device according to an aspect of the present invention includes a memory cell block in which a plurality of memory cells, drain and source select transistors, and side word line transistors are connected in a string structure; a block decoder for outputting a block select signal in response to pre-decoded address signals and for controlling the drain and source select transistors and the side word line transistors; and a block switch for connecting a global word line to word lines of the memory cell block in response to the block select signal.

The block decoder includes a control signal generator for outputting a control signal in response to the predecoded address signals; a precharge unit for precharging an output node in response to first and second high voltage decoding signals; an enable unit for controlling a potential of the output node in response to the control signal; a select signal generator for floating a select node or discharging the select node to a ground power source in response to an operation signal, and a select signal controller for applying a potential of the select node to the drain and source select transistors and the side word line transistors in response to an internal signal of the enable unit.

The control signal generator includes a first NAND gate for logically combining the pre-decoded address signals and for outputting a combination signal, and a second NAND gate for logically combining the combination signal and a program precharge signal and for outputting the control signal.

The precharge circuit includes a switching circuit connected between the output node and a pumping voltage. The precharge circuit is turned on or off in response to the first and second high voltage decoding signals. The switching circuit is turned on to transfer the pumping voltage to the block word line. The precharge circuit also includes a clipping circuit for clipping a voltage of the block word line to a set voltage.

The enable unit includes a NAND gate for logically combining the control signal and a block enable signal and for outputting a discharge signal, and a NMOS transistor connected between the output node and a ground power source. The NMOS transistor discharges the output node in response to the discharge signal.

The select signal generator includes first to third inverters for receiving and buffering the operation signal, and a NMOS transistor connected between the select node and the ground power source. The NMOS transistor connects the select node to the ground power source in response to an output signal of the third inverter.

The select signal controller includes first to fourth NMOS transistors connected between the select node, and a drain select line, a source select line, and side word lines of the memory cell block, respectively. The first to fourth NMOS transistors connect the select node, to the drain select line, the source select line and the side word lines, respectively, in response to the discharge signal.

DESCRIPTION OF SPECIFIC EMBODIMENT

A specific embodiment according to the present invention will be described with reference to the accompanying drawings. However, the present invention is not limited to the disclosed embodiment, but may be implemented in various ways. The embodiment is provided to complete the disclosure of the present invention and to allow those having ordinary skill in the art to understand the scope of the present invention. The present invention is defined by the category of the claims.

Figure 1:
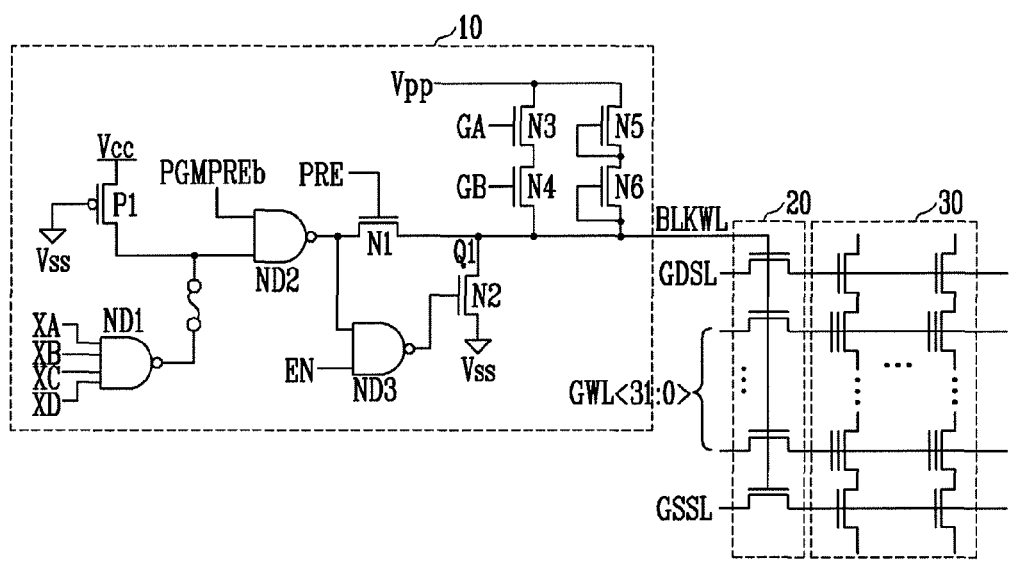
FIG. 1 is a circuit diagram of a conventional semiconductor memory device.
Figure 2:
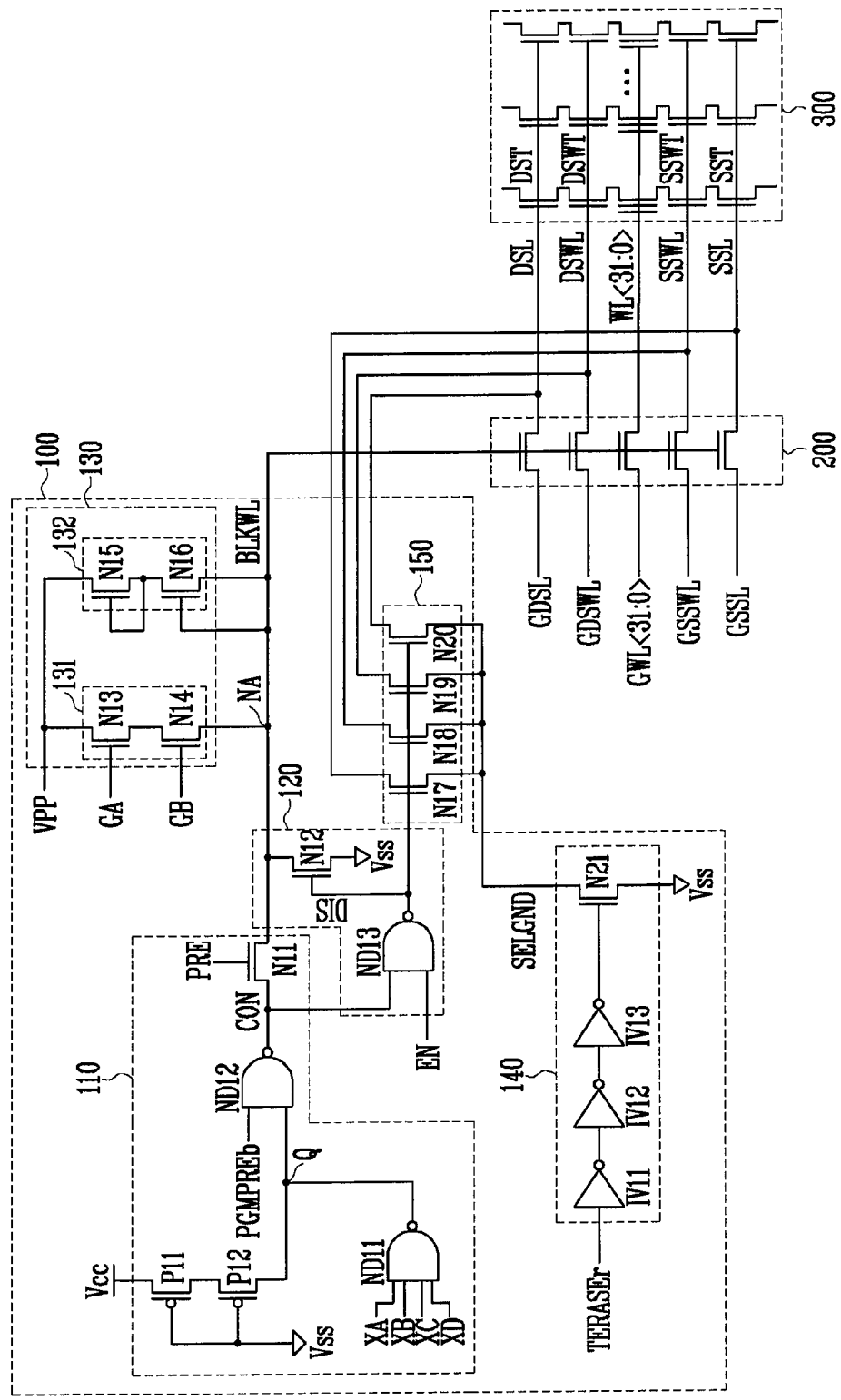
FIG. 2 is a circuit diagram of a semiconductor memory device in accordance with an embodiment of the present invention.

FIG. 2 is a circuit diagram of a semiconductor memory device in accordance with an embodiment of the present invention.

Referring to FIG. 2, a semiconductor memory device includes a memory cell block 300, a block decoder 100 and a block switch 200. The memory cell block 300 includes a plurality of memory cells, drain and source select transistors DST and SST, and side word line transistors DSWT and SSWT connected in a string structure. The block decoder 100 outputs a block select signal BLKWL in response to pre-decoded address signals XA<7:0>, XB<7:0>, XC<7:0> and XD<3:0>. The block switch 200 connects global word lines GWL<0:31>, a global drain select line GDSL, a global source select line GSSL, and global side word lines GDSWL and GSSWL to the memory cell block 300 in response to the block select signal BLKWL.

The side word line transistors DSWT and SSWT of the memory cell block 300 are disposed between the drain and source select transistors DST and SST and the memory cells to reduce a disturbance phenomenon of the memory cells. The side word line transistors DSWT and SSWT operate in the same manner as the drain and source select transistors DST and SST.

The block decoder 100 includes a control signal generator 110, an enable unit 120, a precharge unit 130, a select signal generator 140, and a select signal controller 150.

The control signal generator 110 includes PMOS transistors P11 and P12, NAND gates ND11 and ND12, and a NMOS transistor N11. The PMOS transistors P11 and P12 are connected in series between a node Q and a power source voltage Vcc. The PMOS transistors P11 and P12 apply the power source voltage Vcc to the node Q. The NAND gate ND11 logically combines the pre-decoded address signals XA, XB, XC and XD and outputs a combination result to the node Q. The NAND gate ND12 logically combines a combination signal, output from the NAND gate ND11, and a program precharge signal PGMPREb and outputs a control signal CON. The NMOS transistor N11 transmits the control signal CON to a node NA in response to a precharge signal PRE.

The enable unit 120 includes a NAND gate ND13 and a NMOS transistor N12. The NAND gate ND13 logically combines the control signal CON and a block enable signal EN and outputs a discharge signal DIS. The NMOS transistor N12 is connected between the output node NA and a ground power source Vss. The NMOS transistor N12 discharges the output node NA to the ground power source (Vss) level in response to the discharge signal DIS.

The precharge circuit 130 includes a switching circuit 131 and a clipping circuit 132. The switching circuit 131 includes NMOS transistors N13 and N14. The drain of the NMOS transistor N13 is connected to a pumping voltage Vpp and the source of the NMOS transistor N13 is connected to the drain of the NMOS transistor N14. The source of the NMOS transistor N14 is connected to the block word line BLKWL. First and second address coding signals GA and GB are input to the gates of the NMOS transistors N13 and N14, respectively. NMOS transistors N18 and N19 are turned on or off in response to the first and second address coding signals GA and GB. The NMOS transistors N13 and N14 precharge the block word line BKWL to the pumping voltage (Vpp) level when turned on.

The clipping circuit 132 includes NMOS transistors N15 and N16. The NMOS transistor N15 is diode-connected to the drain of the NMOS transistor N16 in a reverse direction and the NMOS transistor N16 is diode-connected to the block word line BLKWL in a reverse direction. The drain of the NMOS transistor N15 is connected to the pumping voltage Vpp. When a voltage level of the block word line BLKWL raises above a set voltage level, the NMOS transistors N15 and N16 clips the voltage level that is above the set voltage level to maintain the voltage level of the block word line BLKWL at the set voltage level.

The select signal generator 140 includes inverters IV11 to IV13 and a NMOS transistor N21. The inverters IV11 to IV13 are supplied with an operation signal TERASEr, and buffer and output the input operation signal. The operation signal TERASEr is applied to the inverters IV11 to IV13 at a low level during a program or read operation and is applied at a high level during an erase operation. The NMOS transistor N21 is connected between a ground power source Vss and a select node SELGND, and floats the select node SELGND or discharges the select node SELGND to the ground power source (Vss) level in response to an output signal of the inverters IV11 to IV13.

The select signal controller 150 includes NMOS transistors N17 to N20. The NMOS transistors N17 to N20 are connected between the select node SELGND, and a drain select line DSL, a drain side word line DSWL, a source side word line SSWL and a source select line SSL, respectively. The NMOS transistors N17 to N20 connect the drain select line DSL, the drain side word line DSWL, the source side word line SSWL and the source select line SSL, respectively, to the select node SELGND in response to the discharge signal DIS of the enable unit 120.

An operation of the semiconductor memory device constructed above is described below.

First, the block decoder 100 selects the memory cell block 300 as described below.

The precharge circuit 130 precharges the block word line BLKWL to the pumping voltage (Vpp) level when the first and second address coding signals GA and GB are applied at a high level.

To select a block, the pre-decoded address signals XA, XB, XC and XD are applied to the NAND gate ND11 of the control signal generator 110 at a high level. The NAND gate ND11 logically combines the pre-decoded address signals XA, XB, XC and XD and outputs a combination signal at a low level. The NAND gate ND12 outputs the control signal CON at a high level in response to the program precharge signal PGMPREb, which is applied at a high level during a program or read operation, and an output signal of the NAND gate ND11.

The NAND gate ND13 of the enable unit 120 outputs the discharge signal DIS at a low level in response to the control signal CON of a high level and the block enable signal EN of a high level. The NMOS transistor N12 is turned off in response to the discharge signal DIS of a low level. Thus, the node NA maintains the pumping voltage (Vpp) level and outputs the block select signal BLKWL.

The block switch 200 connects the global word lines GWL<0:31>, the global drain select line GDSL, the global source select line GSSL, and the global side word lines GDSWL and GSSWL to the memory cell block 300 in response to the block select signal BLKWL of a high voltage.

A case in which the block decoder 100 does not select the memory cell block 300 is described below.

The precharge circuit 130 precharges the block word line BLKWL to the pumping voltage (Vpp) level when the first and second address coding signals GA and GB are applied at a high level.

At least one of the predecoded address signals XA, XB, XC and XD is applied to the NAND gate ND11 of the control signal generator 110 at a low level. The NAND gate ND11 logically combines the pre-decoded address signals XA, XB, XC and XD and outputs a combination signal at a high level. The NAND gate ND12 outputs the control signal CON at a low level in response to the program precharge signal PGMPREb, which is applied at a high level during a program or read operation, and the output signal of the NAND gate ND11.

The NAND gate ND13 of the enable unit 120 outputs the discharge signal DIS at a high level in response to the control signal CON of a low level and the block enable signal EN of a high level. The NMOS transistor N12 is turned on in response to the discharge signal DIS at a high level. Accordingly, the node NA is discharged to the ground power source (Vss) level.

The block switch 200 disconnects the global word lines GWL<0:31>, the global drain select line GDSL, the global source select line GSSL, and the global side word lines GDSWL and GSSWL from the memory cell block 300 in response to the block select signal BLKWL of a low level.

The operation signal TERASEr is applied at a low level, such that the select signal generator 140 connects the select node SELGND to the ground power source Vss. Further, the select signal controller 150 connects the select node SELGND, to the drain select line DSL, the drain side word line DSWL, the source side word line SSWL and the source select line SSL, in response to the discharge signal DIS of a high level. Thus, the drain and source select transistors and the side word line transistors of the memory cell block 300 are turned off. Accordingly, a leakage current through the memory cells can be prevented.

According to an embodiment of the present invention, when a semiconductor memory device operates, a drain select transistor, a source select transistor and a side transistor of an unselected memory cell block are turned off. Accordingly, a leakage current flowing through memory cells can be prevented and the electrical properties of a device can be improved.

According to an exemplary embodiment of the present invention, the drain side word line (DSWL) and the source side word line (SSWL) are controlled by using the select signal generator 140 and the select signal controller 150. However, in the event of selecting, or not selecting, a cell block, a controller may output an enable signal or a disable signal to the DSWL and SSWL, and thus the same operation can be performed.

The embodiment disclosed herein has been proposed to allow a person skilled in the art to easily implement the present invention, and the person skilled in the part may implement the present invention in various ways. Therefore, the scope of the present invention is not limited by or to the embodiment as described above, and should be construed to be defined only by the appended claims and their equivalents.

What is claimed is:

1. A block decoder comprising:
   a control signal generator configured to output a control signal in response to pre-decoded address signals;
   a precharge circuit configured to precharge an output node to a high voltage in response to high voltage decoding signals;
   an enable unit configured to discharge the output node in response to the control signal; and
   a select signal generator configured to control drain and source select transistors and side word line transistors of a memory cell block in response to the control signal during a program or read operation.

2. The block decoder of claim 1, wherein the select signal generator turns on the drain and source select transistors and the side word line transistors when the memory cell block is selected.

3. The block decoder of claim 1, wherein the select signal generator turns off the drain and source select transistors and the side word line transistors when the memory cell block is not selected.

4. A semiconductor memory device, comprising:
   a memory cell block comprising a plurality of memory cells, a drain select transistor, a source select transistor, and side word line transistors connected in a string structure;
   a block decoder configured to output a block select signal in response to pre-decoded address signals, wherein the block decoder comprises:
   a control signal generator configured to output a control signal in response to the pre-decoded address signals,
   a select signal generator configured to control the side word line transistors of the memory cell block in response to the control signal during a program or read operation; and
   a block switch configured to connect a global word line to the word lines of the memory cell block in response to the block select signal.

5. The semiconductor memory device of claim 4, wherein the block decoder further comprises:
   a precharge circuit configured to precharge an output node to a high voltage in response to first and second high voltage decoding signals; and
   an enable unit configured to discharge the output node in response to the control signal.

6. The semiconductor memory device of claim 5, wherein the select signal generator is configured to float a select node or to discharge the select node to a ground power source in response to an operation signal.

7. The semiconductor memory device of claim 6, further comprising:
   a select signal controller configured to apply a potential of the select node to the drain and source select transistors and the side word line transistors in response to an internal signal of the enable unit.

8. The semiconductor memory device of claim 7, wherein the select signal controller comprises first, second, third and fourth NMOS transistors connected between the select node, and a drain select line, a source select line, and side word lines of the memory cell block, respectively, the first, second, third and fourth NMOS transistors connecting the select node to the drain select line, the source select line and the side word lines, respectively, in response to a discharge signal.

9. The semiconductor memory device of claim 6, wherein the select signal generator comprises:
   first, second and third inverters configured to receive and buffer the operation signal; and
   a NMOS transistor connected between the select node and the ground power source, wherein the NMOS transistor connects the select node to the ground power source in response to an output signal of the third inverter.

10. The semiconductor memory device of claim 5, wherein the precharge circuit comprises:
    a switching circuit connected between the output node and a pumping voltage, wherein the switching circuit is turned on or off in response to the first and second high voltage decoding signals, the switching circuit being turned on to transfer the pumping voltage to a block word line; and
    a clipping circuit for clipping a voltage of the block word line to a set voltage.

11. The semiconductor memory device of claim 5, wherein the enable unit comprises:
    a NAND gate configured logically combine the control signal and a block enable signal and to output a discharge signal; and
    a NMOS transistor connected between the output node and a ground power source, wherein the NMOS transistor discharges the output node in response to the discharge signal.

12. The semiconductor memory device of claim 4, wherein the control signal generator comprises:
    a first NAND gate configured to logically combine the pre-decoded address signals and to output a combination signal; and
    a second NAND gate configured to logically combine the combination signal and a program precharge signal and to output the control signal.

13. The semiconductor memory device of claim 4, wherein the select signal generator turns on the drain and source select transistors and the side word line transistors when the memory cell block is selected.

14. The semiconductor memory device of claim 4, wherein the select signal generator turns off the drain and source select transistors and the side word line transistors when the memory cell block is not selected.

* * * * *